(12) United States Patent
Park et al.

(10) Patent No.: US 9,966,563 B2
(45) Date of Patent: May 8, 2018

(54) DISPLAY DEVICE

(71) Applicant: Samsung Display Co., Ltd., Yongin-si, Gyeonggi-do (KR)

(72) Inventors: Bo Ik Park, Uiwang-si (KR); Sun Ho Kim, Seongnam-si (KR); Young Gug Seol, Hwaseong-si (KR); Jin Hwan Choi, Seoul (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 105 days.

(21) Appl. No.: 14/992,887

(22) Filed: Jan. 11, 2016

(65) Prior Publication Data

US 2016/0343985 A1 Nov. 24, 2016

(30) Foreign Application Priority Data

May 19, 2015 (KR) .......................... 10-2015-0069846

(51) Int. Cl.
*H01L 51/52* (2006.01)
*G06F 3/044* (2006.01)
*G06F 3/041* (2006.01)
*H01L 51/00* (2006.01)
*F03G 7/00* (2006.01)

(52) U.S. Cl.
CPC .......... *H01L 51/5253* (2013.01); *G06F 3/044* (2013.01); *G06F 3/0412* (2013.01); *H01L 51/0097* (2013.01); *H01L 51/52* (2013.01); *F03G 7/005* (2013.01); *G06F 2203/04102* (2013.01); *H01L 51/5293* (2013.01); *H01L 2251/5338* (2013.01); *Y02E 10/549* (2013.01)

(58) Field of Classification Search
CPC .............................. H01L 51/5253; F03G 7/005
See application file for complete search history.

(56) References Cited

U.S. PATENT DOCUMENTS

2003/0062519 A1* 4/2003 Yamazaki ........... H01L 51/5253
257/40
2012/0326564 A1* 12/2012 Takahashi ............... F03G 7/005
310/328

FOREIGN PATENT DOCUMENTS

| KR | 10-0956238 B1 | 4/2010 |
| KR | 10-2011-0106539 A | 9/2011 |
| KR | 10-1245375 B1 | 3/2013 |
| KR | 10-2014-0102087 A | 8/2014 |

* cited by examiner

*Primary Examiner* — Ermias Woldegeorgis
(74) *Attorney, Agent, or Firm* — Knobbe Martens Olson & Bear LLP

(57) ABSTRACT

A display device is disclosed. In one aspect, the display device includes a substrate, a barrier layer formed over the substrate, and an emission layer formed over the barrier layer. The display device also includes a stress-absorbing layer contacting one of the substrate, the barrier layer, and the emission layer. The stress-absorbing layer has a structural density configured to partially vary based on an applied voltage.

15 Claims, 16 Drawing Sheets

DISPLAY DEVICE

CROSS-REFERENCE TO RELATED APPLICATION

This application claims priority to and the benefit of Korean Patent Application No. 10-2015-0069846 filed in the Korean Intellectual Property Office on May 19, 2015, the entire contents of which are incorporated herein by reference.

BACKGROUND

Field

The described technology generally relates to a display device.

Description of the Related Technology

Display panels (devices) are used in various consumer electronics applications including televisions, computer monitors, PDAs, and smart devices, the demands of which have rapidly increased.

High-quality flat display panels include technologies such as organic light-emitting diode (OLED) display panel, liquid crystal displays panel, plasma display panels (PDPs), and electrophoretic display panels.

Flexible display devices that are light and thin with good portability are being developed to fulfill market demand. Such a flexible display device can be implemented by using a flexible substrate, such as plastic, instead of glass.

The above information disclosed in this Background section is only to enhance the understanding of the background of the described technology and therefore it can contain information that does not constitute the prior art that is already known in this country to a person of ordinary skill in the art.

SUMMARY OF CERTAIN INVENTIVE ASPECTS

One inventive aspect relates to a flexible display device that can reduce stress occurring at the flexible part of a display device.

Another aspect is a display device that includes a substrate, a barrier layer formed on the substrate, and an emission layer formed on the barrier layer, the display device including: a stress-absorbing layer that is formed to contact one selected from the substrate, the barrier layer, and emission layer, and the structural density of which is partially varied when a voltage is applied thereto.

The stress-absorbing layer can include a medium, a protection portion surrounding at least one of the outer surfaces of the medium, positive ion polymers and negative ion polymers contained in the medium, and a wire portion electrically connected to the protection portion.

Another aspect is a display device that includes a substrate, a barrier layer formed on the substrate, and an emission layer formed on the barrier layer, the display device including: a stress-absorbing layer that is formed in at least one of the opposite ends of the substrate, the barrier layer, and the emission layer, and the structural density of which is partially varied when a voltage is applied thereto.

The stress-absorbing layer can include a medium, a protection portion surrounding all outer surfaces of the medium, positive ion polymers and negative ion polymers contained in the medium, and a wire portion electrically connected to the protection portion.

The protection portion can include a plurality of receiving portions formed to be partitioned and separated from each other along a length direction of the protection portion so that the medium is filled therein.

The plurality of receiving portions can be formed to be spaced apart from each other.

A vertical width of each of the plurality of receiving portions can be gradually reduced from opposite sides of the protection portion toward the center of the protection portion.

The positive ion polymer can be one selected from a metal positive ion including at least one of iron, calcium, magnesium, potassium, sodium, aluminum, zinc, and nickel, and a metal positive ion combined with an organic compound ligand including the metal positive ion.

The negative ion polymer can be a fluorine-based proton-conducting polymer, and the fluorine-based proton-conducting polymer can be one selected from a perfluorosulfonic acid polymer and a perfluorocarboxylic acid polymer.

The medium can be water.

The emission layer can include a thin film transistor (TFT) electrode, and an organic light emitting element formed on the TFT electrode.

Another aspect is a display device, comprising: a substrate; a barrier layer formed over the substrate; an emission layer formed over the barrier layer; and a stress-absorbing layer contacting one of the substrate, the barrier layer, and the emission layer, wherein the stress-absorbing layer has a structural density configured to partially vary based on an applied voltage.

In the above display device, the stress-absorbing layer includes: a medium including a plurality of positive ion polymers and a plurality of negative ion polymers; a protection layer surrounding at least one of a plurality of outer surfaces of the medium; and a wire portion electrically connected to the protection layer.

In the above display device, the protection layer has a plurality of holes partitioned and separated from each other in a first direction of the protection layer, wherein the medium is substantially filled in the holes.

In the above display device, the holes are spaced apart from each other.

In the above display device, the heights of the holes gradually decrease from opposing sides of the protection layer toward a center of the protection layer interposed between the opposing sides.

In the above display device, each of the positive ion polymers includes one selected from a metal positive ion including at least one of iron, calcium, magnesium, potassium, sodium, aluminum, zinc, and nickel, and a metal positive ion combined with an organic compound ligand including the metal positive ion.

In the above display device, each of the negative ion polymers includes a fluorine-based proton-conducting polymer, wherein the fluorine-based proton-conducting polymer is one selected from a perfluorosulfonic acid polymer and a perfluorocarboxylic acid polymer.

In the above display device, the medium includes water.

In the above display device, the stress-absorbing layer is formed directly on the emission layer and is farther from the substrate than the barrier layer.

In the above display device, the stress-absorbing layer is interposed between the emission layer and the barrier layer.

In the above display device, the stress-absorbing layer is formed directly on the substrate and is farther from the emission layer than the substrate.

The above display device further comprises a controller configured to apply a plurality of voltages to the stress-absorbing layer.

In the above display device, the voltages comprise a first voltage and a second voltage less than the first voltage, wherein the stress-absorbing layer includes a first surface contacting the substrate and a second surface opposing the first surface, and wherein the controller is further configured to apply the first voltage to the first surface and a second voltage to the second surface.

In the above display device, the positive ion polymers are configured to move toward the first surface and the negative ion polymers are configured to move toward the second surface, when the first and second voltages are respectively applied to the first and second surfaces.

In the above display device, the emission layer includes: a thin film transistor (TFT) electrode; and an organic light-emitting diode (OLED) formed over the TFT electrode.

Another aspect is a display device, comprising: a substrate; a barrier layer formed over the substrate; an emission layer formed over the barrier layer; and a stress-absorbing layer formed contacting one or two of the substrate, the barrier layer, and the emission layer, wherein the stress-absorbing layer has a structural density configured to partially vary based on an applied voltage.

In the above display device, the stress-absorbing layer includes: a medium having a plurality of outer surfaces, wherein the medium includes at least one positive ion polymer and at least one negative ion polymer; a protection layer surrounding all of the outer surfaces of the medium; and a wire layer electrically connected to the protection layer.

The above display device further comprises a mechanical layer formed on the emission layer and the substrate, wherein the mechanical layer is configured to prevent moisture from permeating into the emission layer and the substrate.

The above display device further comprises a mechanical layer including: a touch sensor including a capacitive touch panel; a window configured to protect a top surface of the emission layer from the environment; and a polarization film configured to polarize external light to increase visibility of the external light.

Another aspect is a display device, comprising: a substrate; an emission layer formed over the substrate; and a stress-absorbing layer contacting one or two of the substrate, the barrier layer, and the emission layer, wherein the stress-absorbing layer comprises at least one positive ion polymer and at least one negative ion polymer.

According to at least one of the disclosed embodiments, it is possible to reduce stress occurring at a flexible part of a display device through a stress-absorbing layer. Therefore, it is possible to prevent the life of the display device from being reduced, and elements and wires thereof from being damaged, due to stress occurring while the display device is bent.

BRIEF DESCRIPTION OF THE DRAWINGS

FIG. 5B schematically illustrates the stress-absorbing layer, the wire portion of which is formed to have a plate shape.

FIG. 5C schematically illustrates the stress-absorbing layer, each wire portion of which is formed at opposite sides of a protection portion.

DETAILED DESCRIPTION OF CERTAIN INVENTIVE EMBODIMENTS

Figure 1:
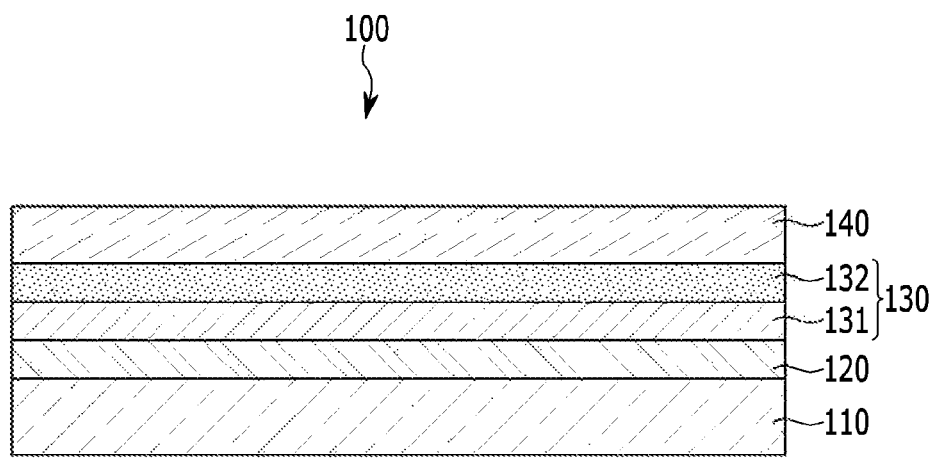
FIG. 1 illustrates a schematic diagram of a display device according to a first exemplary embodiment.

The described technology will be described more fully hereinafter with reference to the accompanying drawings, in which exemplary embodiments of the described technology are shown. As those skilled in the art would realize, the described embodiments can be modified in various different ways, all without departing from the spirit or scope of the described technology.

The drawings and description are to be regarded as illustrative in nature and not restrictive, and like reference numerals designate like elements throughout the specification.

Further, in exemplary embodiments, for components having the same configuration, like reference numerals are used and described only in a representative embodiment, and in other exemplary embodiments, only different configurations from the representative embodiment will be described.

Throughout this specification and the claims that follow, when it is described that an element is "coupled" to another element, the element can be "directly coupled" to the other element or "indirectly coupled" to the other element through a third element. In addition, unless explicitly described to the contrary, the word "comprise" and variations such as "comprises" or "comprising" will be understood to imply the inclusion of stated elements but not the exclusion of any other elements. In this disclosure, the term "substantially" includes the meanings of completely, almost completely or to any significant degree under some applications and in accordance with those skilled in the art. Moreover, "formed on" can also mean "formed over." The term "connected" can include an electrical connection.

FIG. 1 illustrates a schematic diagram of a display device according to a first exemplary embodiment.

Referring to FIG. 1, a display device 100 according to a first exemplary embodiment includes a substrate 110, a barrier layer 120, and an emission layer 130.

The emission layer 130 can be formed on the substrate 110. The substrate 110 can be formed of a material such as polyimide and the like.

The barrier layer 120 is formed on the substrate 110. The barrier layer 120 can prevent moisture from permeating into a lower portion of emission layer 130. The barrier layer 120 and the substrate 110 can be bonded by an optically transparent adhesive film, which is not shown. Herein, the barrier layer 120 is not limited to be formed between the substrate 110 and the emission layer 130, and it can be formed on a bottom surface of the substrate 110 or a top surface of the emission layer 130, depending on the design.

The emission layer 130 is formed on the barrier layer 120. The emission layer 130 can include, for example, a thin film transistor (TFT) electrode 131 and an organic light emitting element (or an OLED layer) 132. The organic light emitting element 132 is formed on the TFT electrode 131.

As described above, the display device 100 according to the first exemplary embodiment includes a stress-absorbing layer 140.

The stress-absorbing layer 140 is formed to contact one selected from the substrate 110, the barrier layer 120, and emission layer 130. For example, the stress-absorbing layer 140 is formed on a top surface of the emission layer 130.

The structural density (or distribution) of the stress-absorbing layer 140 is partially varied when a voltage is applied thereto. For example, although the structural density of the stress-absorbing layer 140 is substantially uniform before a voltage is applied thereto, the structural density of an upper portion of the stress-absorbing layer 140 can be greater than that of a lower portion thereof when a voltage is applied thereto. Alternatively, the structural density of the lower portion of the stress-absorbing layer 140 can be greater than that of the upper portion thereof.

The stress-absorbing layer 140 absorbs stress occurring when the display device 100 according to the first exemplary embodiment is bent.

Various structures of the display device 100 according to the exemplary embodiment will now be described with reference to the accompanying drawings.

Figure 2:
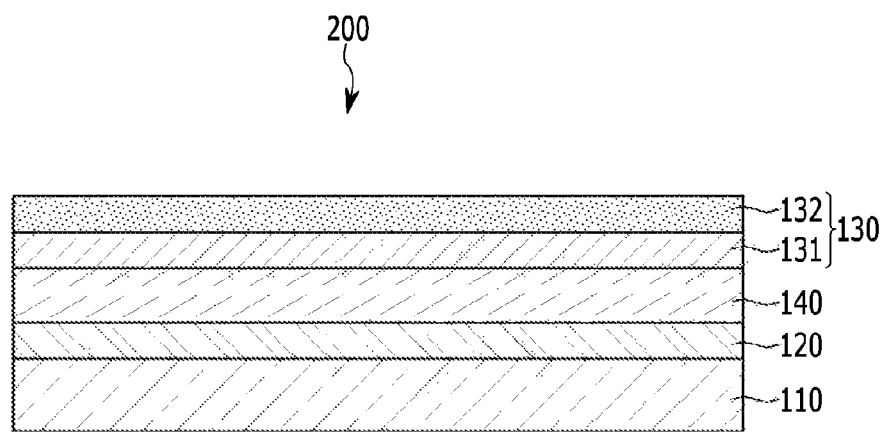
FIG. 2 illustrates a schematic diagram of a display device according to a second exemplary embodiment.

FIG. 2 illustrates a schematic diagram of a display device according to a second exemplary embodiment.

As shown in FIG. 2, in a display device 200 according to the second exemplary embodiment, the stress-absorbing layer 140 is interposed between the emission layer 130 and the barrier layer 120.

Figure 3:
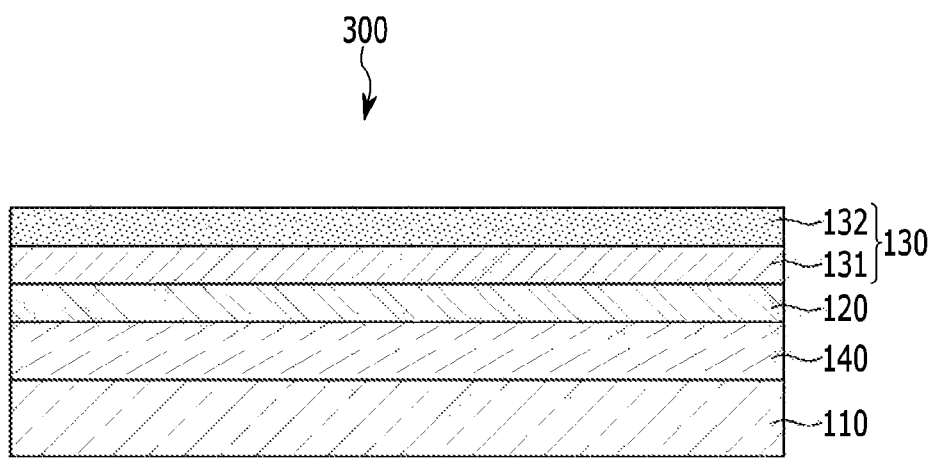
FIG. 3 illustrates a schematic diagram of a display device according to a third exemplary embodiment.

FIG. 3 illustrates a schematic diagram of a display device according to a third exemplary embodiment.

As shown in FIG. 3, in a display device 300 according to the third exemplary embodiment, the stress-absorbing layer 140 is interposed between the barrier layer 120 and the substrate 110.

Figure 4:
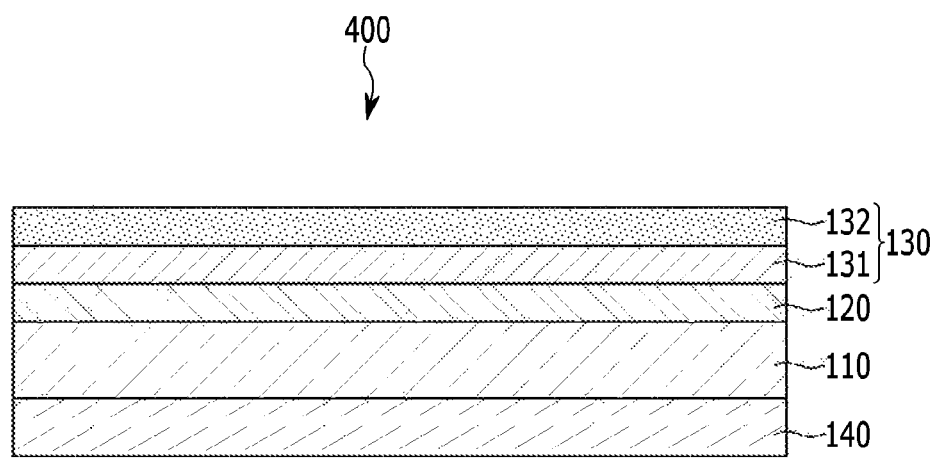
FIG. 4 illustrates a schematic diagram of a display device according to a fourth exemplary embodiment.

FIG. 4 illustrates a schematic diagram of a display device according to a fourth exemplary embodiment.

As shown in FIG. 4, in a display device 400 according to the fourth exemplary embodiment, the stress-absorbing layer 140 is formed on an outer surface of the substrate 110.

The above-described stress-absorbing layer 140 is formed at various positions of the display devices (100, 200, 300, and 400) to absorb stress occurring when the display devices (100, 200, 300, and 400) are bent.

A detailed structure of the stress-absorbing layer 140 and various exemplary modifications will now be described with reference to the accompanying drawings.

Figure 5A:
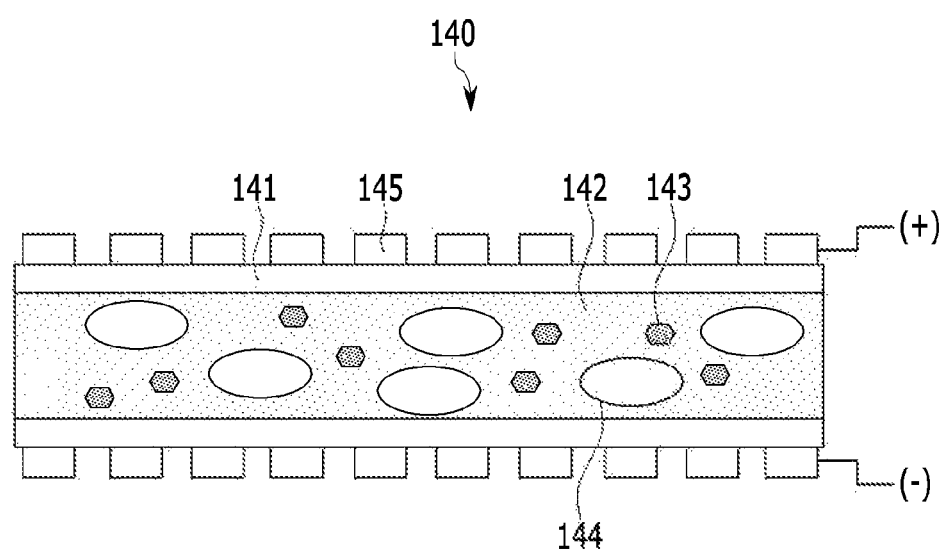
FIG. 5A schematically illustrates a structure of a stress-absorbing layer provided in the display devices illustrated in FIGS. 1 to 4.

FIG. 5A schematically illustrates a structure of a stress-absorbing layer provided in the display devices illustrated in FIGS. 1 to 4.

Referring to FIG. 5A, an upper structure of the stress-absorbing layer 140 includes a medium 142, a protection portion (or protection layer) 141, positive ion polymers 144, negative ion polymers 143, and a wire portion (or wire) 145.

The medium 142 has fluidity. The medium 142 is a material in a gel state. For example, the medium 142 includes water.

The protection portion 141 surrounds or covers at least one surface of the medium 142. The protection portion 141 protects the medium 142 from the outside. The protection portion 141 can be formed by chemically coating one selected from gold and platinum.

The positive ion polymers 144 and the negative ion polymers 143 are included in the medium 142. The positive ion polymers 144 and the negative ion polymers 143 can freely move inside the medium 142. When electric field is generated in the medium 142, the positive ion polymers 144 are moved to a negative electrode, and the negative ion polymers 143 are moved to a positive electrode. The positive ion polymer 144 can be, for example, one selected from a metal positive ion including at least one of iron, calcium, magnesium, potassium, sodium, aluminum, zinc, and nickel, and a metal positive ion combined with an organic compound ligand including the metal positive ion.

The negative ion polymer 143 can be, for example, a fluorine-based proton-conducting polymer. The fluorine-based proton-conducting polymer can be, for example, a perfluorosulfonic acid polymer such as Nafion from DuPont or a perfluorocarboxylic acid polymer such as Flemion from Asahi Glass Company.

Herein, the positive ion polymers 144 can be relatively greater in size than the negative ion polymers 143. Accordingly, even though a plurality of negative ion polymers 143 are gathered together and then compressed, stress does not occur excessively. Therefore, when the negative ion polymers 143 are forced to be gathered in a portion compressed by an external force, stress generated in the compressed portion can be minimized.

The wire portion 145 is electrically connected to an outer surface of the protection portion 141 so that electricity is supplied. The wire portion 145 is formed on each of the outer surfaces of the protection portion 141 based on the medium 142. The wire portion 145 can be formed on the protection portion 141 in a pattern form.

When a voltage is applied to the wire portion 145, a positive electrode can be formed at one side of the medium 142, and a negative electrode can be formed at the other side thereof. When the wire portion 145 is formed in the pattern form, the strength of the electric field can be partially changed depending on the density of the wire portion 145.

Meanwhile, a power source (not illustrated) electrically connected to the wire portion 145 can be provided so that electric power can be supplied to the wire portion 145.

Figure 5B:
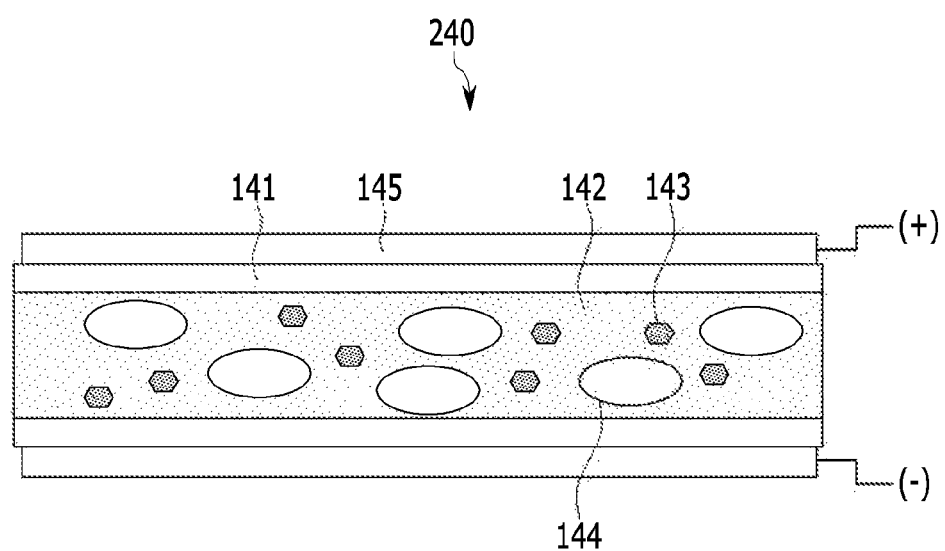
FIGS. 5B and 5C illustrate various modifications of the stress-absorbing layer illustrated in FIG. 5A.
Figure 5C:
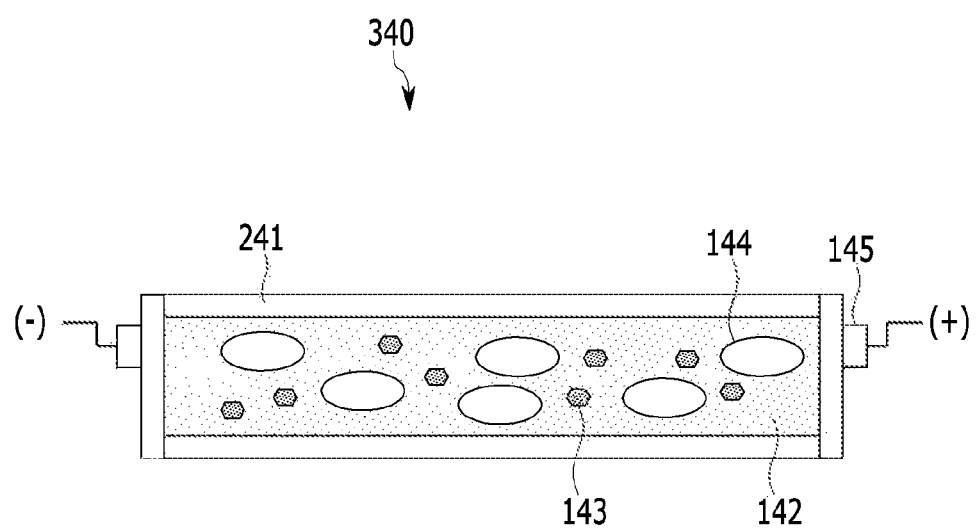

FIGS. 5B and 5C illustrate various modifications of the stress-absorbing layer illustrated in FIG. 5A.

FIG. 5B schematically illustrates the stress-absorbing layer, the wire portion 145 of which is formed to have a plate shape. As shown in FIG. 5B, in a stress-absorbing layer 240 according a first exemplary modification, there is a structural difference from the above-described wire portion 145 of FIG. 5A in that a wire portion 145 of FIG. 5B has a plate shape.

FIG. 5C schematically illustrates the stress-absorbing layer 340, each wire portion of which is formed at opposite sides of a protection portion.

As shown in FIG. 5C, in a stress-absorbing layer 340 according to a second exemplary modification, a wire portion 145 is formed at each opposite side of the protection portion 141. In this case, the protection portion 241 can be formed to entirely surround the outer surface of the medium 142.

When electric power is applied to the protection portion 241 through the wire portion 145, positive ion polymers 144 are gathered at one side of the protection portion 141, and negative ion polymers 143 are gathered at the other side of the protection portion 141. For example, as shown in FIG. 5C, when a positive electrode is formed at a right end of the protection portion 141 and a negative electrode is formed at a left end of the protection portion 141, the negative ion polymers 143 are gathered at the right end of the protection portion 141. Further, the positive ion polymers 144 are gathered at the left end of the protection portion 141.

Figure 6:
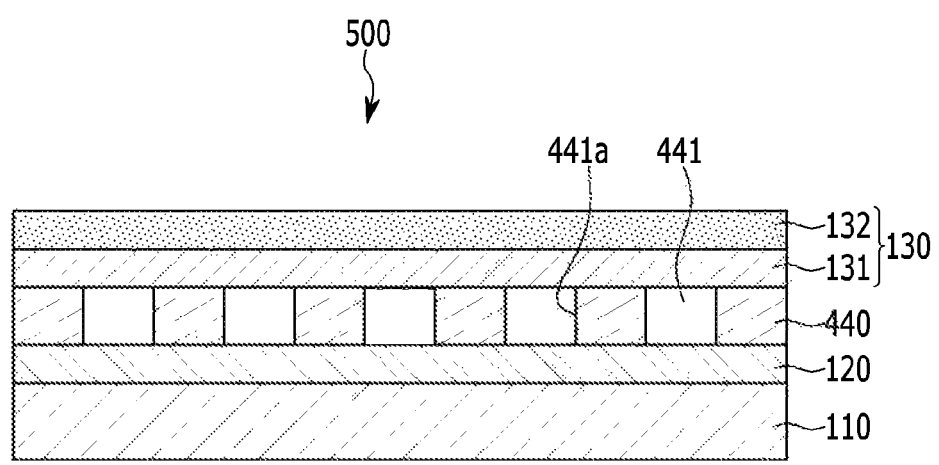
FIG. 6 illustrates a schematic diagram of a display device according to a fifth exemplary embodiment.

FIG. 6 illustrates a schematic diagram of a display device according to a fifth exemplary embodiment.

Referring to FIG. 6, in a stress-absorbing layer 440 included in a display device 500 according to the fifth exemplary embodiment, a protection portion 441 includes a plurality of receiving portions (or holes) 441a. The receiving portions 441a are formed to be partitioned and separated from each other along a length direction of the protection portion 441.

Figure 7A:
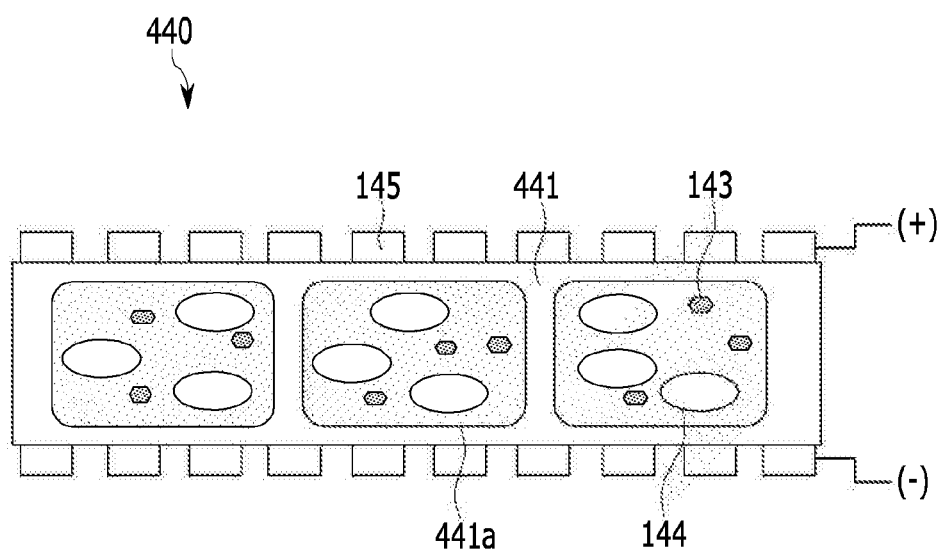
FIG. 7A illustrates a detailed structure of the stress-absorbing layer included in the display device illustrated in FIG. 6.

FIG. 7A illustrates a detailed structure of the stress-absorbing layer included in the display device illustrated in FIG. 6.

Referring to FIG. 7A, the medium 142 is filled in each of the receiving portions 441a. Compared to the previously described stress-absorbing layer 140, since space occupied by the medium 142 inside the stress-absorbing layer 140 can be reduced, the medium 142, the negative ion polymers 143, and the positive ion polymers 144 can be used relatively less in a manufacturing process thereof.

Figure 7B:
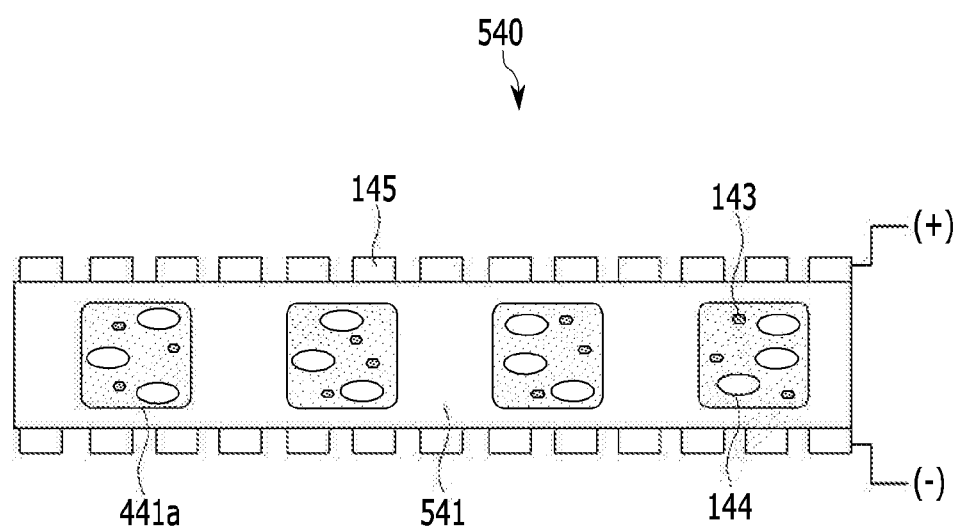
FIG. 7B illustrates an exemplary modification of the stress-absorbing layer illustrated in FIG. 7A.

FIG. 7B illustrates an exemplary modification of the stress-absorbing layer illustrated in FIG. 7A.

Referring to FIG. 7B, the receiving portions 441a can be formed to be spaced apart from each other in the protection portion 541 included in the stress-absorbing layer 540.

Compared to the stress-absorbing layer 440 shown in FIG. 7A, smaller amounts of the medium 142, the negative ion polymers 143, and the positive ion polymers 144 can also be used in a manufacturing process of the stress-absorbing layer 540.

Figure 8:
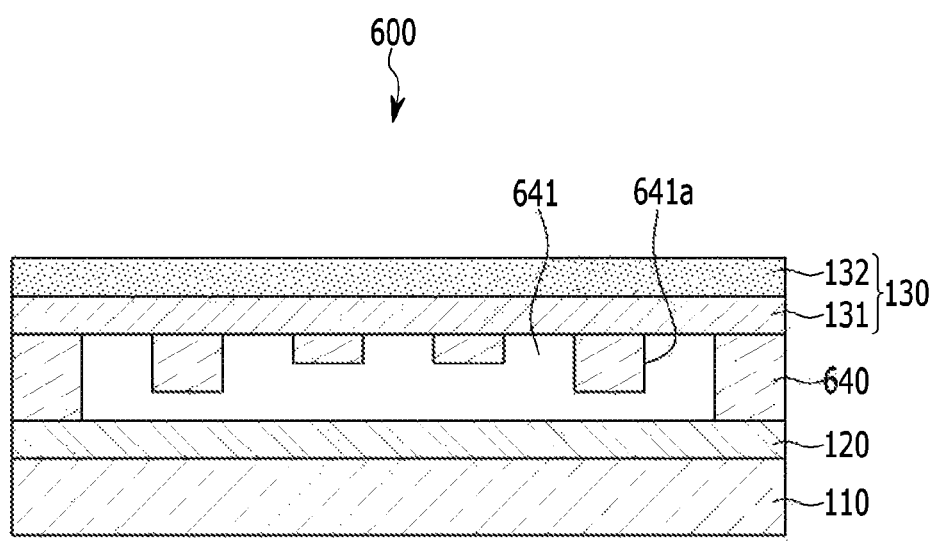
FIG. 8 illustrates a schematic diagram of a display device according to a sixth exemplary embodiment.
Figure 9:
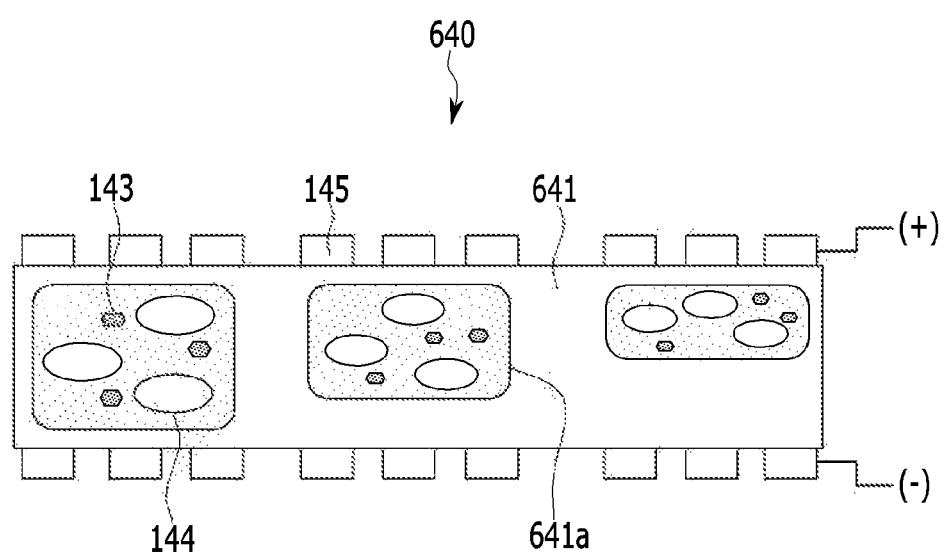
FIG. 9 illustrates only a stress-absorbing layer included in the display device illustrated in FIG. 8.

FIG. 8 illustrates a schematic diagram of a display device according to a sixth exemplary embodiment. FIG. 9 illustrates only a stress-absorbing layer included in the display device illustrated in FIG. 8.

Referring to FIGS. 8 and 9, a display device 600 according to the sixth exemplary embodiment is formed to have a structure in which a vertical width of each of a plurality of receiving portions 641a is gradually reduced from opposite sides of a protection portion 641 included in a stress-absorbing layer 640 toward the center thereof.

Figure 10:
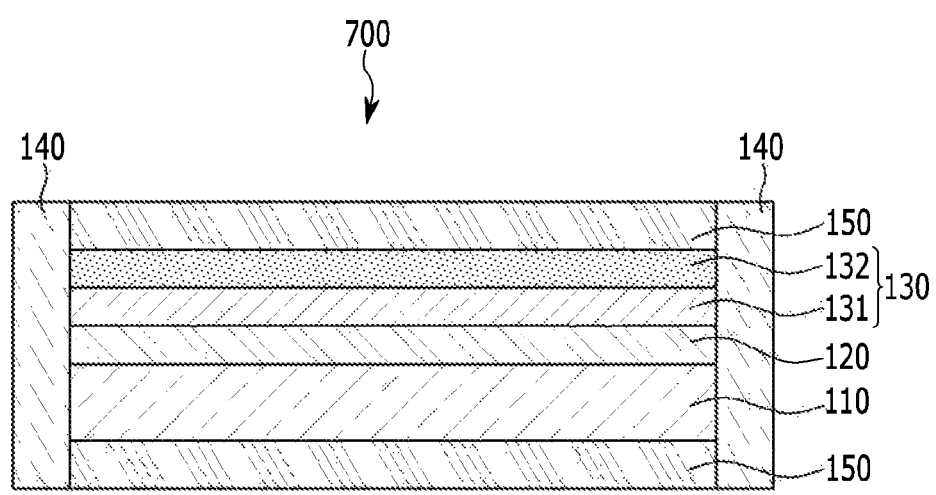
FIG. 10 illustrates a schematic diagram of a display device according to a seventh exemplary embodiment.

FIG. 10 illustrates a schematic diagram of a display device according to a seventh exemplary embodiment.

Referring to FIG. 10, in a display device 700 according to the seventh exemplary embodiment, the stress-absorbing layer 140 is formed in at least one of the opposite ends of the substrate 110, the barrier layer 120, and the emission layer 130.

In this case, a mechanical portion 150 can be respectively formed on a top surface of the emission layer 130 and a bottom surface of the substrate 110. The mechanical portion 150 formed on the top surface of the emission layer 130 can be a touch sensor, a window, a polarization film, and the like. The mechanical portion 150 formed on the bottom surface of the substrate 110 can be a moisture-preventing film.

A capacitance touch panel can be applied as the touch sensor. However, the touch sensor is not limited to the capacitance touch panel, and it can be any touch panel that can recognize a touch of a user.

The window can be an element of a transparent plate shape. The window can protect the top surface of the emission layer 130 from outside contact. A material of the window can be plastic or glass.

The polarization film absorbs some external light and polarizes the remaining light, thereby improving visibility of the external light.

The moisture-preventing film can prevent external moisture from penetrating thereunder.

Since the touch sensor, the window, the polarization film, and the moisture-preventing film are generally included in the display devices, detailed descriptions thereof will be omitted.

The mechanical portion 150 formed on the top surface of the emission layer 130 and the bottom surface of the substrate 110 is not limited to the above-described contents, and it can be substituted with elements necessary for substantial operation of the display device 700.

Figure 11:
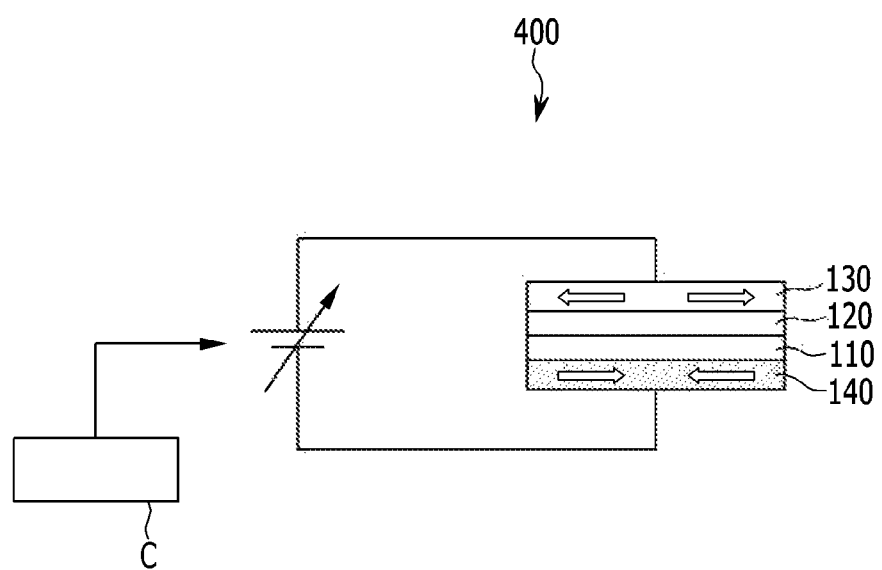
FIG. 11 illustrates a schematic diagram of the display device illustrated in FIG. 4 according to the fourth exemplary embodiment.

FIG. 11 illustrates a schematic diagram of the display device illustrated in FIG. 4 according to the fourth exemplary embodiment.

A voltage applied to the stress-absorbing layer 140 of the display device 400 according to the described technology can be controlled by a controller (C). The controller (C) can control overall operation of the display device 100. Alternatively, the controller (C) can control only operation of the stress-absorbing layer 140.

A state in which a voltage is not applied to the stress-absorbing layer 140 of the display device 400 and a state in which a voltage is applied thereto as the display device 100 is bent will now be described with reference to the accompanying drawings.

Figure 12:
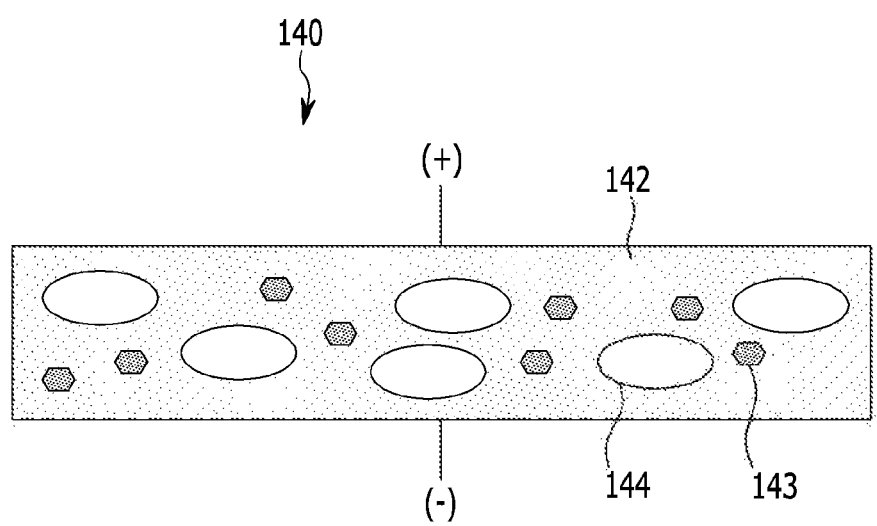
FIG. 12 illustrates a state in which a voltage is not applied to a stress-absorbing layer included in a display device according to an exemplary embodiment.

FIG. 12 illustrates a state in which a voltage is not applied to a stress-absorbing layer included in a display device according to an exemplary embodiment.

Referring to FIG. 12, since a voltage is not applied to the wire portion 145 of FIG. 5A in a state in which the display device 100 according to the exemplary embodiment is not bent, the negative ion polymers 143 and the positive ion polymers 144 inside the medium 142 maintain an initial position thereof.

Figure 13:
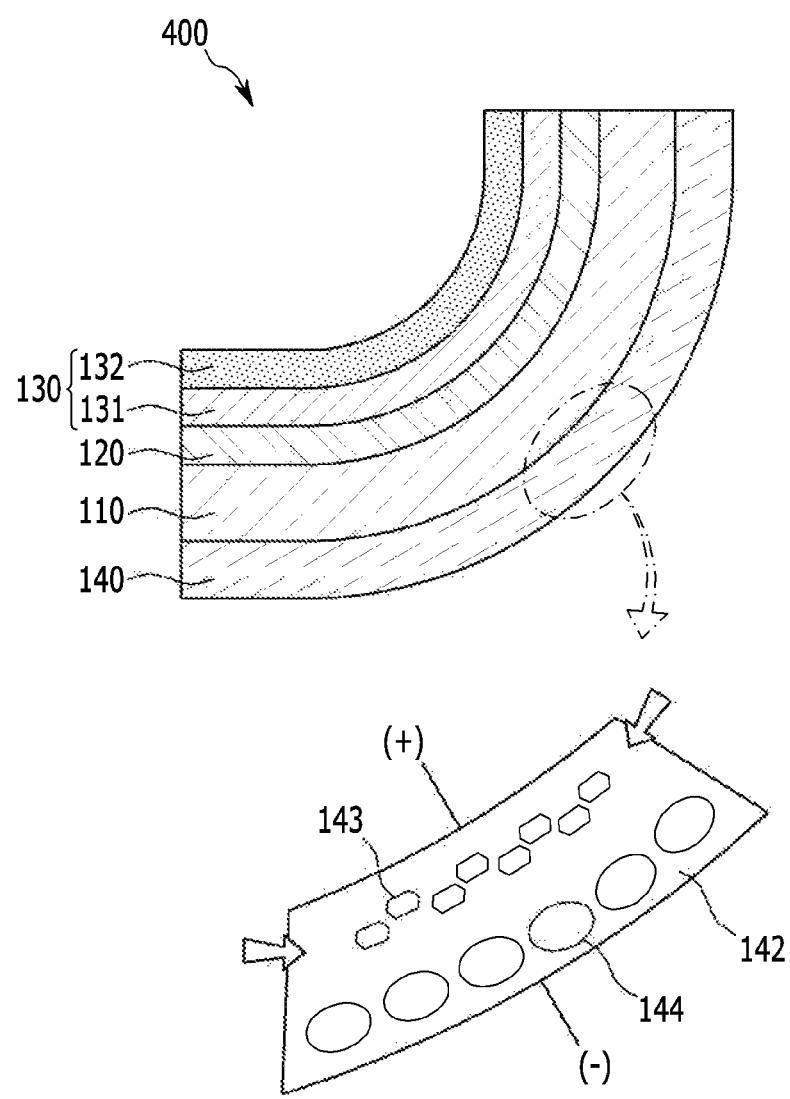
FIG. 13 illustrates an enlarged view of inside a stress-absorbing layer in a state in which the display device illustrated in FIG. 4 according to the fourth exemplary embodiment is bent.

FIG. 13 illustrates an enlarged view of inside a stress-absorbing layer in a state in which the display device illustrated in FIG. 4 according to the fourth exemplary embodiment is bent.

Referring to FIG. 13, when the display device 100 according to the exemplary embodiment is bent by an external force, a voltage is applied to the wire portion 145 of FIG. 5A. Herein, a positive electrode can be formed at a portion to which a compressed stress is applied in the medium 142, and a negative electrode can be formed at a portion to which a stretched stress is applied in the medium 142.

The negative ion polymers 143 are gathered in the positive electrode, and the positive ion polymers 144 are gathered in the negative electrode. That is, the negative ion polymers 143 are gathered in the portion to which the compressed stress is applied. Since the negative ion polymers 143 are relatively smaller in size than the positive ion polymers 144, the portion to which the compressed stress is applied is easily compressed, such that stress can be reduced.

According to at least one of the disclosed embodiments, a display device can reduce stress occurring at a portion in which the display device is bent, through the stress-absorbing layer. Accordingly, it is possible to prevent the life of the display device from being reduced, and elements and wires thereof from being damaged, due to stress occurring while the display device is bent.

What is claimed is:

1. A display device, comprising:
   a substrate;
   a barrier layer on the substrate;
   an emission layer on the barrier layer;
   a stress-absorbing layer contacting one of the substrate, the barrier layer, and the emission layer; and
   a controller configured to apply a voltage to the stress-absorbing layer in response to the display device being bent by an external force, wherein the stress-absorbing layer is configured to change its electrical charge distribution based on the applied voltage, and
   wherein the stress-absorbing layer includes:
   a medium including a plurality of positive ion polymers and a plurality of negative ion polymers;
   a protection layer completely surrounding outer surfaces of the medium; and
   a wire portion electrically connected to the protection layer and the controller.

2. The display device of claim 1, wherein the protection layer has a plurality of holes partitioned and separated from each other in a first direction of the protection layer, and wherein the medium is substantially filled in the holes.

3. The display device of claim 2, wherein the holes are spaced apart from each other.

4. The display device of claim 3, wherein the heights of the holes gradually decrease from opposing sides of the protection layer toward a center of the protection layer interposed between the opposing sides.

5. The display device of claim 1, wherein each of the positive ion polymers includes one selected from a metal positive ion including at least one of iron, calcium, magnesium, potassium, sodium, aluminum, zinc, and nickel, and a metal positive ion combined with an organic compound ligand including the metal positive ion.

6. The display device of claim 1, wherein each of the negative ion polymers includes a fluorine-based proton-conducting polymer, and wherein the fluorine-based proton-conducting polymer is one selected from a perfluorosulfonic acid polymer and a perfluorocarboxylic acid polymer.

7. The display device of claim 1, wherein the medium includes water.

8. The display device of claim 1, wherein the stress-absorbing layer is formed directly on the emission layer and is farther from the substrate than the barrier layer.

9. The display device of claim 1, wherein the stress-absorbing layer is interposed between the emission layer and the barrier layer.

10. The display device of claim 1, wherein the stress absorbing layer is formed directly on the substrate and is farther from the emission layer than the substrate.

11. The display device of claim 1, wherein the applied voltage comprises a plurality of voltages, wherein the voltages comprise a first voltage and a second voltage less than the first voltage, wherein the stress-absorbing layer includes a first surface contacting the substrate and a second surface opposing the first surface, and wherein the controller is further configured to apply the first voltage to the first surface and a second voltage to the second surface.

12. The display of claim 11, wherein the positive ion polymers are configured to move toward the first surface and the negative ion polymers are configured to move toward the second surface, when the first and second voltages are respectively applied to the first and second surfaces.

13. The display device of claim 1, wherein the emission layer includes:
   a thin film transistor (TFT) electrode; and
   an organic light-emitting diode (OLED) on the TFT electrode.

14. A display device, comprising:
   a substrate;
   an emission layer on the substrate;
   a stress-absorbing layer contacting one of either the substrate or the emission layer; and
   a controller configured to apply a voltage to the stress-absorbing layer in response to the display device being bent by an external force, wherein the stress-absorbing layer comprises at least one positive ion polymer and at least one negative ion polymer, wherein the stress-absorbing layer comprises at least one positive ion polymer and at least one negative ion polymer,
   wherein the stress-absorbing layer includes:
   a medium including a plurality of positive ion polymers and a plurality of negative ion polymers;
   a protection layer completely surrounding outer surfaces of the medium; and
   a wire portion electrically connected to the protection layer and the controller.

15. The display device of claim 1, wherein the barrier layer is formed only on one side of the stress-absorbing layer.

* * * * *